US012640708B2

(12) United States Patent (10) Patent No.: US 12,640,708 B2
Khlat (45) Date of Patent: May 26, 2026

(54) MULTI-FREQUENCY CAPACITANCE CANCELLATION IN AN ACOUSTIC FILTER CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 35 days.

(21) Appl. No.: 18/774,026

(22) Filed: Jul. 16, 2024

(65) Prior Publication Data

US 2025/0062749 A1 Feb. 20, 2025

Related U.S. Application Data

(60) Provisional application No. 63/590,512, filed on Oct. 16, 2023, provisional application No. 63/520,452, filed on Aug. 18, 2023.

(51) Int. Cl.
H03H 9/54 (2006.01)

(52) U.S. Cl.
CPC .................................. H03H 9/542 (2013.01)

(58) Field of Classification Search
CPC ..... H03H 9/542; H03H 7/09; H03H 2210/025
See application file for complete search history.

(56) References Cited

U.S. PATENT DOCUMENTS

| 3,568,108 A | 3/1971 | Poirier et al. |
| 4,924,195 A | 5/1990 | Gonda |

| 6,242,843 B1 | 6/2001 | Pohjonen et al. |
| 6,862,441 B2 | 3/2005 | Ella |
| 7,034,638 B2 | 4/2006 | Yamamoto et al. |

(Continued)

FOREIGN PATENT DOCUMENTS

| CN | 107727125 A | 2/2018 |
| DE | 102007028290 A1 | 1/2009 |

(Continued)

OTHER PUBLICATIONS

Qorvo US, Inc., "Acoustic LP filtering for High Frequency Spurious Harmonics Rejections," Technical Disclosure Commons, Dec. 13, 2022, Qorvo US, Inc., 8 pages.

(Continued)

*Primary Examiner* — Andrea Lindgren Baltzell
*Assistant Examiner* — Kimberly E Glenn
(74) *Attorney, Agent, or Firm* — Withrow & Terranova, P.L.L.C.

(57) ABSTRACT

Multi-frequency capacitance cancellation in an acoustic filter circuit is provided. The acoustic filter circuit includes an acoustic resonator configured to resonate in a series resonance frequency to pass a radio frequency (RF) signal. However, the acoustic resonator may create an electrical capacitance that can cause the acoustic resonator to resonate at multiple operating frequencies outside the series resonance frequency, thus compromising performance of the acoustic resonator at these operating frequencies. Herein, a negative capacitance circuit is provided in parallel to the acoustic resonator and configured to present multiple negative capacitances to cancel (or at least reduce) the electrical capacitance at the operating frequencies. As a result, it is possible to improve the performance of the acoustic filter circuit across a broader frequency bandwidth.

20 Claims, 5 Drawing Sheets

ACOUSTIC FILTER CIRCUIT 10

(56) References Cited

U.S. PATENT DOCUMENTS

| | | | |
|---|---|---|---|
| 7,161,434 | B2 | 1/2007 | Rhodes |
| 7,367,095 | B2 | 5/2008 | Larson, III et al. |
| 7,454,178 | B2 | 11/2008 | Block et al. |
| 7,573,354 | B2 | 8/2009 | Nishihara et al. |
| 7,656,228 | B2 | 2/2010 | Fukuda et al. |
| 7,659,796 | B2 | 2/2010 | Funami et al. |
| 7,692,270 | B2 | 4/2010 | Subramanyam et al. |
| 7,791,436 | B2 | 9/2010 | Bardal et al. |
| 7,804,374 | B1 | 9/2010 | Brown et al. |
| 7,876,179 | B2 | 1/2011 | Bauer et al. |
| 8,269,577 | B2 | 9/2012 | Inoue et al. |
| 8,576,024 | B2 | 11/2013 | Erb et al. |
| 9,041,484 | B2 * | 5/2015 | Burgener ................. H03H 9/54 |
| | | | 333/133 |
| 9,190,979 | B2 | 11/2015 | Granger-Jones et al. |
| 9,255,912 | B2 | 2/2016 | Johnston et al. |
| 9,281,800 | B2 | 3/2016 | Tsuzuki |
| 9,438,202 | B2 | 9/2016 | Reinhardt et al. |
| 9,583,806 | B2 | 2/2017 | Cho et al. |
| 9,705,473 | B2 | 7/2017 | David et al. |
| 9,819,327 | B2 | 11/2017 | Maruthamuthu et al. |
| 9,847,769 | B2 | 12/2017 | Khlat et al. |
| 10,009,010 | B2 | 6/2018 | Kando et al. |
| 10,243,537 | B2 | 3/2019 | Khlat |
| 10,425,061 | B1 | 9/2019 | Varela Campelo |
| 10,476,481 | B2 | 11/2019 | Chen et al. |
| 10,873,317 | B2 | 12/2020 | Shen et al. |
| 10,985,731 | B2 | 4/2021 | Khlat |
| 11,050,412 | B2 | 6/2021 | Khlat et al. |
| 11,095,268 | B2 | 8/2021 | Schmidhammer |
| 11,165,412 | B2 | 11/2021 | Khlat et al. |
| 11,165,413 | B2 | 11/2021 | Khlat et al. |
| 11,323,097 | B2 | 5/2022 | Kankar et al. |
| 11,742,818 | B2 | 8/2023 | Khlat |
| 2002/0021192 | A1 | 2/2002 | Klee et al. |
| 2002/0158717 | A1 | 10/2002 | Toncich |
| 2002/0163400 | A1 | 11/2002 | Toncich |
| 2003/0227338 | A1 | 12/2003 | Kawakubo et al. |
| 2004/0119561 | A1 | 6/2004 | Omote |
| 2006/0098723 | A1 | 5/2006 | Toncich et al. |
| 2007/0107519 | A1 | 5/2007 | Liu et al. |
| 2007/0131032 | A1 | 6/2007 | Liu |
| 2007/0296513 | A1 | 12/2007 | Ruile et al. |
| 2008/0065290 | A1 | 3/2008 | Breed et al. |
| 2008/0129416 | A1 | 6/2008 | Volatier et al. |
| 2009/0289526 | A1 | 11/2009 | Sinha et al. |
| 2009/0315643 | A1 | 12/2009 | Yamakawa et al. |
| 2010/0308933 | A1 | 12/2010 | See et al. |
| 2012/0212304 | A1 | 8/2012 | Zhang et al. |
| 2012/0313731 | A1 | 12/2012 | Burgener et al. |
| 2013/0109332 | A1 * | 5/2013 | Aigner ................... H03H 9/568 |
| | | | 333/186 |
| 2014/0070905 | A1 | 3/2014 | Raieszadeh et al. |
| 2014/0203887 | A1 | 7/2014 | Murata et al. |
| 2015/0163044 | A1 | 6/2015 | Analui et al. |
| 2016/0191012 | A1 | 6/2016 | Khlat et al. |
| 2016/0191016 | A1 | 6/2016 | Khlat et al. |
| 2016/0294423 | A1 | 10/2016 | Yatsenko et al. |
| 2017/0040948 | A1 | 2/2017 | Levesque |
| 2017/0048859 | A1 | 2/2017 | Hayakawa |
| 2017/0093370 | A1 | 3/2017 | Khlat et al. |
| 2017/0201233 | A1 | 7/2017 | Khlat |
| 2017/0214389 | A1 | 7/2017 | Tsutsumi |
| 2017/0230066 | A1 | 8/2017 | Little et al. |
| 2017/0244382 | A1 | 8/2017 | Lear |
| 2017/0264268 | A1 | 9/2017 | Schmidhammer |
| 2018/0076793 | A1 | 3/2018 | Khlat et al. |
| 2018/0123562 | A1 | 5/2018 | Bradley |
| 2018/0159562 | A1 | 6/2018 | Bauder |
| 2018/0234078 | A1 | 8/2018 | Wada et al. |
| 2019/0081613 | A1 | 3/2019 | Nosaka |
| 2019/0199324 | A1 | 6/2019 | Matsumoto et al. |
| 2019/0260355 | A1 | 8/2019 | Khlat |
| 2019/0326944 | A1 | 10/2019 | Khlat et al. |
| 2019/0393860 | A1 | 12/2019 | Shih et al. |
| 2020/0028491 | A1 | 1/2020 | Kuroyanagi |
| 2020/0028567 | A1 | 1/2020 | Ashworth |
| 2020/0076366 | A1 | 3/2020 | Bahr et al. |
| 2020/0099360 | A1 | 3/2020 | Khlat |
| 2020/0099362 | A1 | 3/2020 | Khlat |
| 2020/0099363 | A1 | 3/2020 | Khlat |
| 2020/0099364 | A1 | 3/2020 | Khlat |
| 2020/0136589 | A1 | 4/2020 | Khlat |
| 2020/0274519 | A1 | 8/2020 | Gamble et al. |
| 2021/0067139 | A1 | 3/2021 | Komatsu et al. |
| 2021/0194459 | A1 | 6/2021 | Alavi et al. |
| 2021/0399750 | A1 | 12/2021 | Varela Campelo |
| 2022/0385272 | A1 | 12/2022 | Sun et al. |
| 2023/0093885 | A1 | 3/2023 | Ella et al. |
| 2023/0134889 | A1 | 5/2023 | Costa |
| 2023/0216485 | A1 | 7/2023 | Wu et al. |
| 2023/0223920 | A1 | 7/2023 | Koohi et al. |
| 2023/0223922 | A1 | 7/2023 | Koohi et al. |
| 2023/0223926 | A1 | 7/2023 | Koohi et al. |
| 2023/0299746 | A1 | 9/2023 | Levesque |
| 2023/0318569 | A1 | 10/2023 | Jhung |
| 2023/0412149 | A1 | 12/2023 | Khlat |
| 2024/0014803 | A1 | 1/2024 | Khlat |
| 2024/0053193 | A1 | 2/2024 | Khlat |
| 2024/0097650 | A1 | 3/2024 | Khlat et al. |
| 2024/0213956 | A1 | 6/2024 | Khlat et al. |
| 2024/0258992 | A1 | 8/2024 | Khlat |
| 2024/0333257 | A1 | 10/2024 | Khlat |
| 2024/0333259 | A1 | 10/2024 | Khlat |
| 2024/0364309 | A1 | 10/2024 | Khlat |
| 2024/0413809 | A1 | 12/2024 | Khlat |

FOREIGN PATENT DOCUMENTS

| | | | |
|---|---|---|---|
| JP | 3854212 | B2 | 12/2006 |
| JP | 2009130831 | A | 6/2009 |
| JP | 4326063 | B2 | 9/2009 |
| JP | 2022548348 | A | 11/2022 |
| RU | 166154 | U1 | 11/2016 |
| WO | 2024034528 | A1 | 2/2024 |

OTHER PUBLICATIONS

Qorvo US, Inc., "Multipe Notch Filter Using On-Die BAW MIM Cap," Technical Disclosure Commons, Dec. 12, 2022, Qorvo US, Inc., 10 pages.

Elkholy, M. et al., "Low-Loss Integrated Passive CMOS Electrical Balance Duplexers With Single-Ended LNA," IEEE Transactions on Microwave Theory and Techniques, vol. 64, No. 5, May 2016, IEEE, pp. 1544-1559.

Kang, P. et al., "Dual-Band Cmos Rf Front-End Employing an Electrical-Balance Duplexer an N-Path LNA for IBFD and FDD Radios," IEEE Transactions on Microwave Theory and Techniques, vol. 69, No. 7, Jul. 2021, IEEE, pp. 3528-3539.

Yu, X., "Design of reconfigurable multi-mode RF circuits," A dissertation submitted to the graduate faculty in partial fulfillment of the requirements for the degree of Doctor of Philosophy, Iowa State University, Ames, Iowa, 2013, 127 pages.

Khan, A.I. et al., "Negative Capacitance in a Ferroelectric Capacitor," Nature Materials, vol. 14, Feb. 2015, first published Dec. 2014, Macmillan Publishers Limited, pp. 182-186.

Ghosh, S. et al., "Experimental Observation of Electron-Phonon Interaction in Semiconductor on Solidly Mounted Thin-Film Lithium Niobate," 2022 IEEE MTT-S International Conference on Microwave Acoustics and Mechanics (IC-MAM), Jul. 18-20, 2022, Munich, Germany, IEEE, 4 pages.

Gokhale, V. et al., "Phonon-Electron Interactions in Piezoelectric Semiconductor Bulk Acoustic Wave Resonators," Scientific Reports, vol. 4, Article No. 5617, Jul. 2014, 10 pages.

Sis, S.A., "Ferroelectric-on-Silicon Switchable Bulk Acoustic Wave Resonators and Filters for RF Applications," A dissertation submitted in partial fulfillment of the requirements for the degree of Doctor of Philosophy (Electrical Engineering) in The University of Michigan, 2014, 152 pages.

(56)                    References Cited

OTHER PUBLICATIONS

Tirado, J.V., "Bulk Acoustic Wave Resonators and their Application to Microwave Devices," Ph.D Dissertation, Department of Telecommunications and Systems Engineering, Universitat Autonoma de Barcelona (UAB), 2010, 201 pages.

* cited by examiner

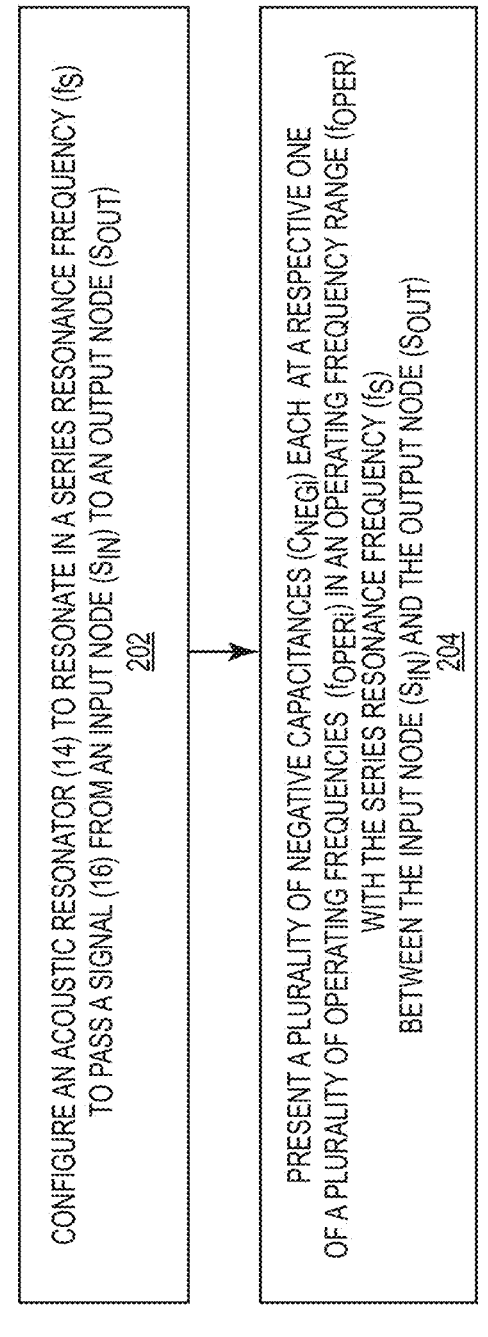

CONFIGURE AN ACOUSTIC RESONATOR (14) TO RESONATE IN A SERIES RESONANCE FREQUENCY (fs) TO PASS A SIGNAL (16) FROM AN INPUT NODE (SIN) TO AN OUTPUT NODE (SOUT)
202

PRESENT A PLURALITY OF NEGATIVE CAPACITANCES (CNEGi) EACH AT A RESPECTIVE ONE OF A PLURALITY OF OPERATING FREQUENCIES (fOPERi) IN AN OPERATING FREQUENCY RANGE (fOPER) WITH THE SERIES RESONANCE FREQUENCY (fs) BETWEEN THE INPUT NODE (SIN) AND THE OUTPUT NODE (SOUT)
204

*FIG. 4*

MULTI-FREQUENCY CAPACITANCE CANCELLATION IN AN ACOUSTIC FILTER CIRCUIT

RELATED APPLICATIONS

This application claims the benefit of U.S. provisional patent application Ser. No. 63/520,452, filed on Aug. 18, 2023, and U.S. provisional patent application Ser. No. 63/590,512, filed on Oct. 16, 2023, the disclosures of which are hereby incorporated herein by reference in their entireties.

FIELD OF THE DISCLOSURE

The technology of the disclosure relates generally to cancelling an electrical capacitance at multiple operating frequencies in an acoustic filter circuit.

BACKGROUND

Wireless devices have become increasingly common in current society. The prevalence of these wireless devices is driven in part by the many functions that are now enabled on such devices for supporting a variety of applications. In this regard, a wireless device may employ a variety of circuits and/or components (e.g., filters, transceivers, antennas, and so on) to support different numbers and/or types of applications. Accordingly, the wireless device may include a number of switches to enable dynamic and flexible couplings between the variety of circuits and/or components.

Acoustic resonators, such as Surface Acoustic Wave (SAW) resonators and Bulk Acoustic Wave (BAW) resonators, are used in many high-frequency communication applications. In particular, SAW resonators are often employed in filter networks that operate at frequencies up to 1.8 GHZ, and BAW resonators are often employed in filter networks that operate at frequencies above 1.5 GHz. Such SAW and BAW-based filters have flat passbands, steep filter skirts, and squared shoulders at the upper and lower ends of the passbands, and provide excellent rejection outside of the passbands. SAW and BAW-based filters also have a relatively low insertion loss, tend to decrease in size as the frequency of operation increases, and are relatively stable over wide temperature ranges.

As such, SAW and BAW-based filters are the filter of choice for many 3rd Generation (3G) and 4th Generation (4G) wireless devices and are destined to dominate filter applications for 5th Generation (5G) wireless devices. Most of these wireless devices support cellular, wireless fidelity (Wi-Fi), Bluetooth, and/or near field communications on the same wireless device and, as such, pose extremely challenging filtering demands. While these demands keep raising the complexity of wireless devices, there is a constant need to improve the performance of acoustic resonators and filters that are based thereon.

SUMMARY

Aspects disclosed in the detailed description include multi-frequency capacitance cancellation in an acoustic filter circuit. The acoustic filter circuit includes an acoustic resonator configured to resonate in a series resonance frequency to pass a radio frequency (RF) signal. However, the acoustic resonator may create an electrical capacitance that can cause the acoustic resonator to resonate at multiple operating frequencies outside the series resonance frequency, thus compromising performance of the acoustic resonator at these operating frequencies. Herein, a negative capacitance circuit is provided in parallel to the acoustic resonator and configured to present multiple negative capacitances to cancel (or at least reduce) the electrical capacitance at the operating frequencies. As a result, it is possible to improve the performance of the acoustic filter circuit across a broader frequency bandwidth.

In one aspect, an acoustic filter circuit is provided. The acoustic filter circuit includes an acoustic resonator. The acoustic resonator is coupled between an input node and an output node. The acoustic resonator is configured to resonate in a series resonance frequency to pass an RF signal from the input node to the output node. The acoustic filter circuit also includes a negative capacitance circuit. The negative capacitance circuit is coupled in parallel to the acoustic resonator between the input node and the output node. The negative capacitance circuit is configured to present multiple negative capacitances each at a respective one of multiple operating frequencies in an operating frequency range nonoverlapping with the series resonance frequency between the input node and the output node.

In another aspect, a wireless device is provided. The wireless device includes an acoustic filter circuit. The acoustic filter circuit includes an acoustic resonator. The acoustic resonator is coupled between an input node and an output node. The acoustic resonator is configured to resonate in a series resonance frequency to pass an RF signal from the input node to the output node. The acoustic filter circuit also includes a negative capacitance circuit. The negative capacitance circuit is coupled in parallel to the acoustic resonator between the input node and the output node. The negative capacitance circuit is configured to present multiple negative capacitances each at a respective one of multiple operating frequencies in an operating frequency range nonoverlapping with the series resonance frequency between the input node and the output node.

In another aspect, a method for cancelling multiple capacitances in an acoustic filter circuit is provided. The method includes configuring an acoustic resonator to resonate in a series resonance frequency to pass an RF signal from an input node to an output node. The method also includes presenting multiple negative capacitances each at a respective one of multiple operating frequencies in an operating frequency range nonoverlapping with the series resonance frequency between the input node and the output node.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

FIG. 4 is a flowchart of an exemplary process whereby the acoustic filter circuit can be configured to present the negative capacitances at the operating frequencies, respectively.

DETAILED DESCRIPTION

Figure 1:
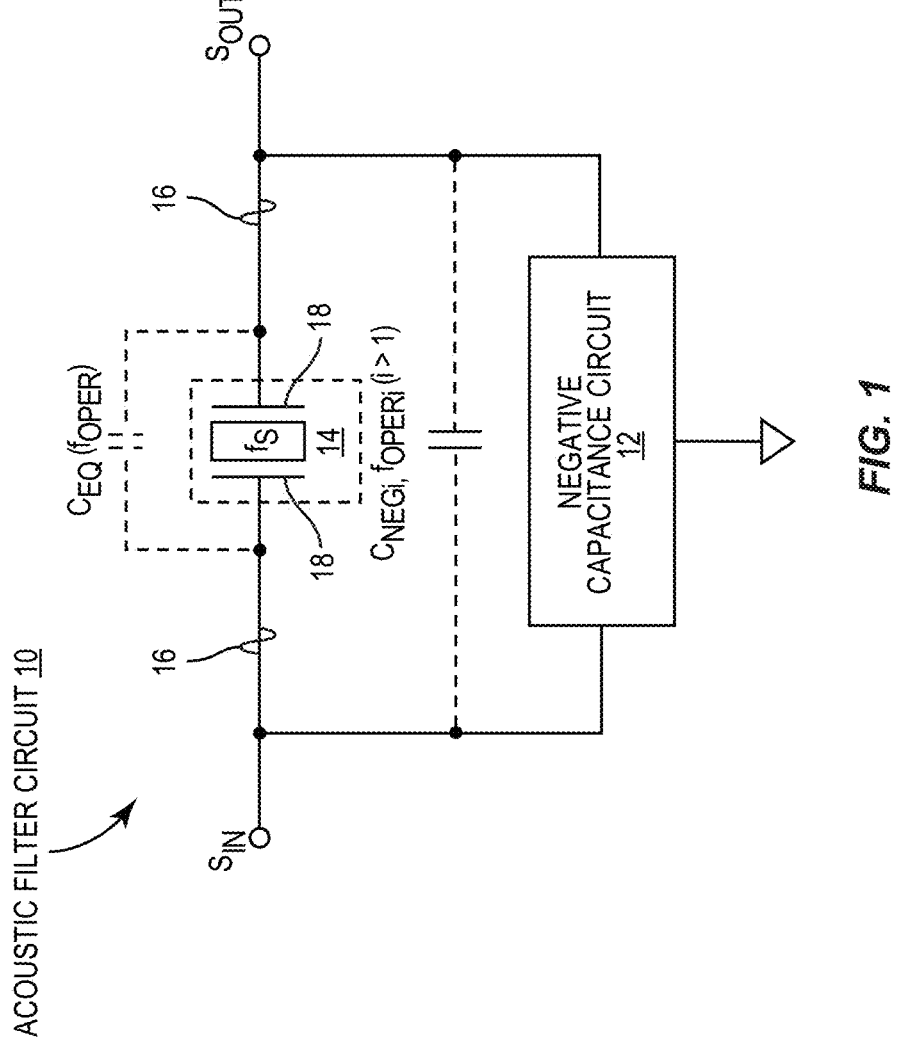
FIG. 1 is a schematic diagram of an exemplary acoustic filter circuit wherein a negative capacitance circuit is configured to present multiple negative capacitances at multiple operating frequencies, respectively.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include multi-frequency capacitance cancellation in an acoustic filter circuit. The acoustic filter circuit includes an acoustic resonator configured to resonate in a series resonance frequency to pass a radio frequency (RF) signal. However, the acoustic resonator may create an electrical capacitance that can cause the acoustic resonator to resonate at multiple operating frequencies outside the series resonance frequency, thus compromising performance of the acoustic resonator at these operating frequencies. Herein, a negative capacitance circuit is provided in parallel to the acoustic resonator and configured to present multiple negative capacitances to cancel (or at least reduce) the electrical capacitance at the operating frequencies. As a result, it is possible to improve performance of the acoustic filter circuit across a broader frequency bandwidth.

FIG. 1 is a schematic diagram of an exemplary acoustic filter circuit 10 wherein a negative capacitance circuit 12 is configured to present multiple negative capacitances $C_{NEGi}$ (i>1) at multiple operating frequencies $f_{OPERi}$ (i>1) in an operating frequency range $f_{OPER}$ ($f_{OPERi} \in f_{OPER}$), respectively. The acoustic filter circuit 10 includes an acoustic resonator 14, which is configured to resonate in a series resonance frequency $f_S$ to pass a signal 16 from an input node $S_{IN}$ to an output node $S_{OUT}$ and block the signal 16 between the input node $S_{IN}$ and the output node Sour in the operating frequency range $f_{OPER}$. Herein, the series resonance frequency $f_S$ and the operating frequency range $f_{OPER}$ are a pair of non-overlapping frequency ranges.

The acoustic resonator 14 is typically made with a pair of metal electrodes 18 that can present an equivalent electrical capacitance $C_{EQ}$ in parallel to the acoustic resonator 14 in each of the operating frequencies $f_{OPERi}$ across the operating frequency range $f_{OPER}$. The electrical capacitance $C_{EQ}$ may be determined based on equation (Eq. 1) below.

$$C_{EQ} = I_{LOAD}(t) \bigg/ \left( \frac{dV(t)}{dt} \right) \qquad \text{(Eq. 1)}$$

In the equation (Eq. 1) above, $I_{LOAD}(t)$ represents a time-variant load current flowing through a load (not shown) connected to the output node Sour and dV(t)/dt represents a time-variant voltage applied across the acoustic resonator 14. Notably, the electrical capacitance $C_{EQ}$ can cause the acoustic resonator 14 to resonate across the operating frequency range $f_{OPER}$, thus resulting in parallel resonance in the acoustic resonator 14. Consequently, the acoustic resonator 14 may not be able to effectively block the signal 16 across the operating frequency range $f_{OPER}$, thus compromising performance of the acoustic resonator 14. As such, it may be desired to eliminate the electrical capacitance $C_{EQ}$ across the operating frequency range $f_{OPER}$.

In this regard, the negative capacitance circuit 12 is provided in parallel to the acoustic resonator 14 between the input node $S_{IN}$ and the output node $S_{OUT}$. The negative capacitance circuit 12 can be configured according to various embodiments of the present disclosure to present different negative capacitances $C_{NEGi}$ (i>1) at different operating frequencies $f_{OPERi}$ (i>1) in the operating frequency range $f_{OPER}$ to thereby cancel, or at least reduce, the electrical capacitance $C_{EQ}$ across an entire operating frequency range $f_{OPER}$ of the acoustic resonator 14. By cancelling the electrical capacitance $C_{EQ}$ across the entire operating frequency range $f_{OPER}$ of the acoustic resonator 14, it is possible to improve a signal rejection across the operating frequency range $f_{OPER}$ to thereby improve overall performance of the acoustic filter circuit 10.

Detailed embodiments of the negative capacitance circuit 12 are now discussed with reference to FIGS. 2A and 2B. Common elements between FIGS. 1, 2A, and 2B are shown therein with common element numbers and will not be re-described herein.

Figure 2A:
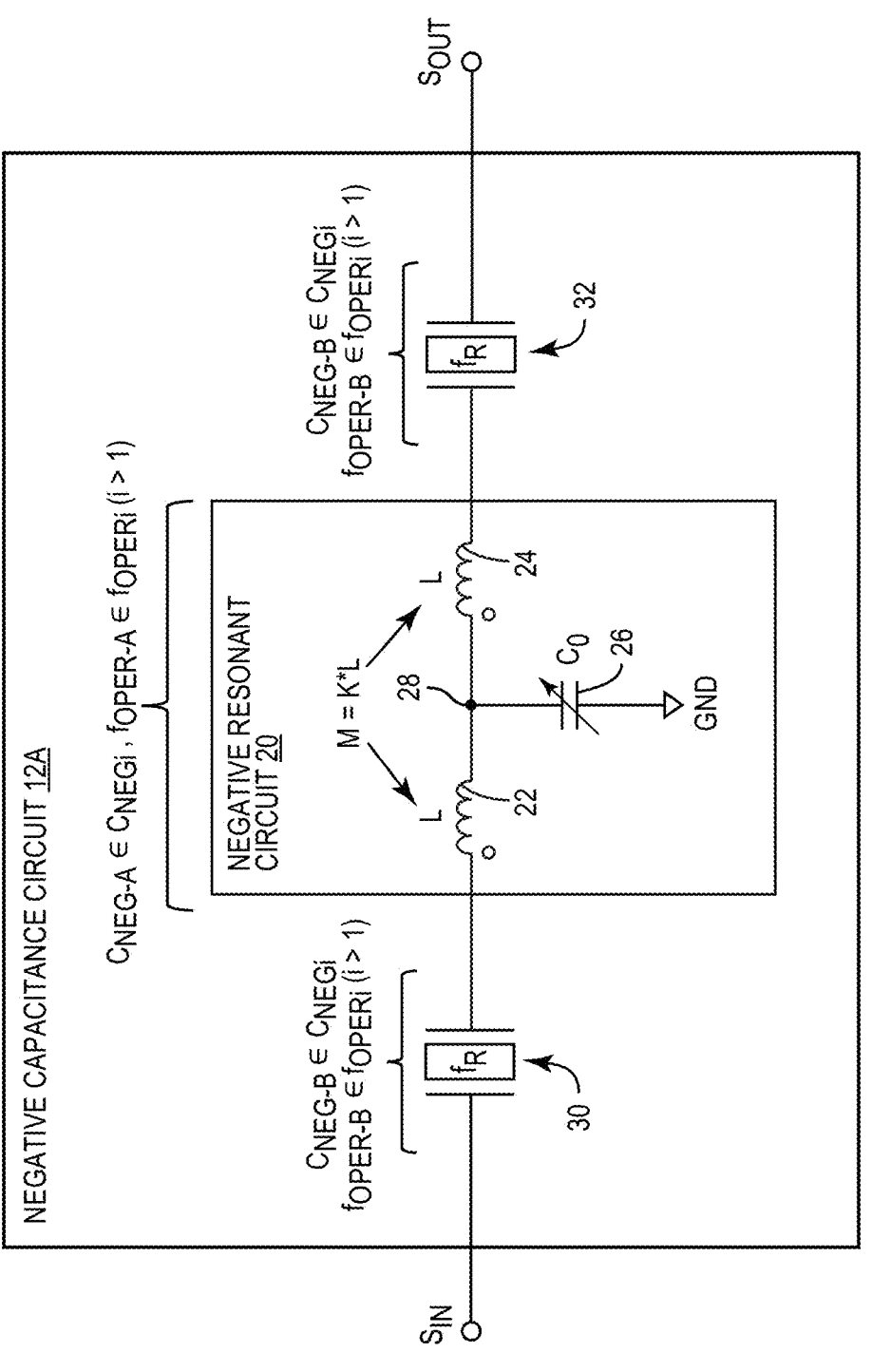
FIG. 2A is a schematic diagram of the negative capacitance circuit in FIG. 1 configured according to one embodiment of the present disclosure.
Figure 2B:
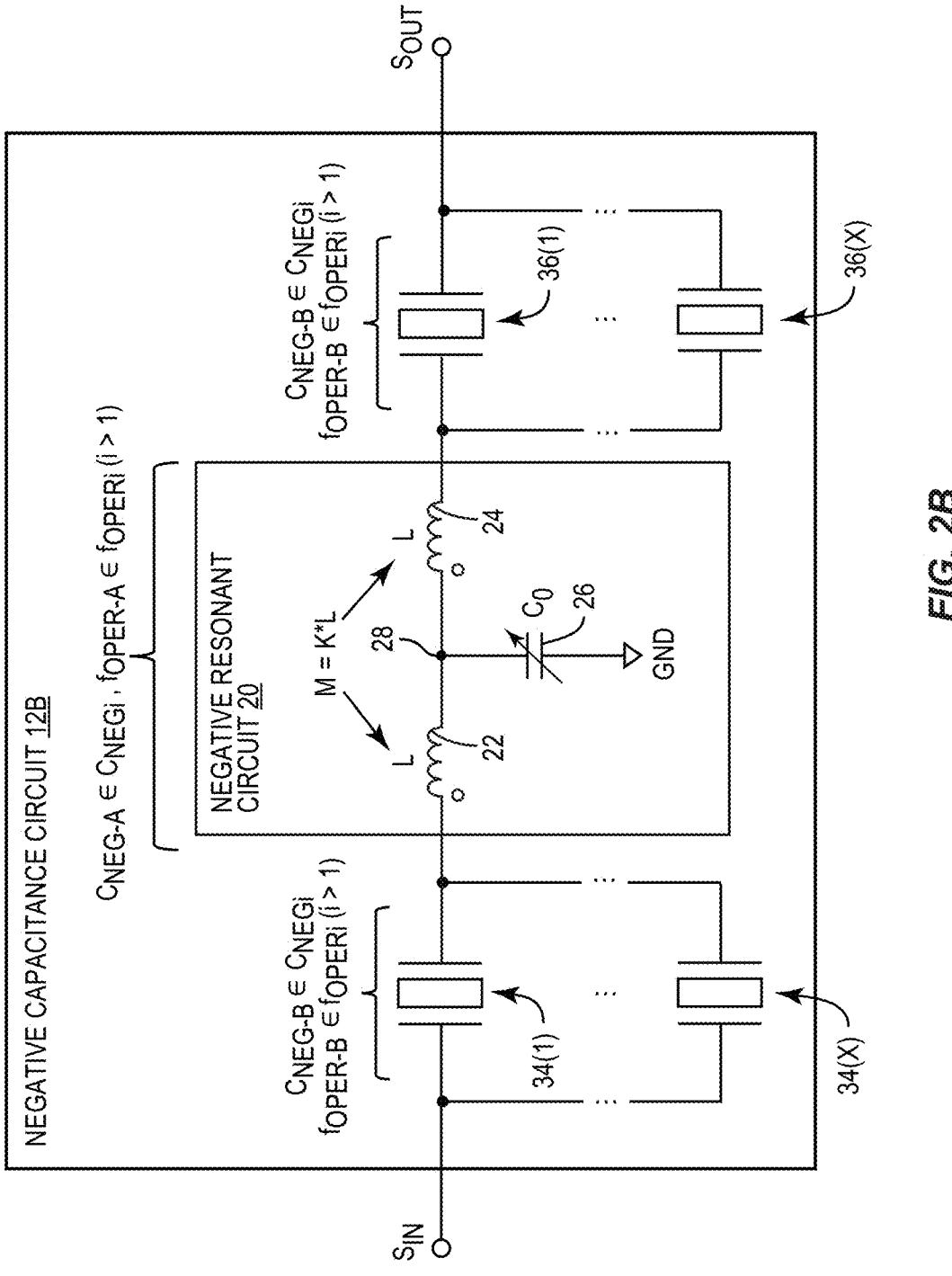
FIG. 2B is a schematic diagram of the negative capacitance circuit in FIG. 1 configured according to another embodiment of the present disclosure.

FIG. 2A is a schematic diagram of an exemplary negative capacitance circuit 12A configured according to one embodiment of the present disclosure to be provided in the acoustic filter circuit 10 of FIG. 1 as the negative capacitance circuit 12. The negative capacitance circuit 12A includes a negative resonant circuit 20. The negative resonant circuit 20 includes a pair of negatively coupled inductors 22, 24 and a tunable capacitor 26. The first inductor 22 is coupled between the input node $S_{IN}$ and a middle node 28. The second inductor 24 is coupled between the middle node 28 and the output node $S_{OUT}$. The tunable capacitor 26 is coupled between the middle node 28 and a ground (GND). The first inductor 22 and the second inductor 24 each has an inductance L and collectively provide a mutual inductance M based on a coupling factor K (0<K<1). The tunable capacitor 26 can be tuned to provide a capacitance $C_0$, which may be identical to or different from the electrical capacitance $C_{EQ}$.

The negative capacitance circuit 12A also includes a first acoustic resonator 30 and a second acoustic resonator 32. The first acoustic resonator 30 is coupled between the input node $S_{IN}$ and the negative resonant circuit 20. The second acoustic resonator 32 is coupled between the negative resonant circuit 20 and the output node Sour. Herein, the first acoustic resonator 30 is identical to the second acoustic resonator 32 in that both the first acoustic resonator 30 and the second acoustic resonator 32 will resonate at an identical resonance frequency $f_R$.

In one embodiment, the negative resonant circuit 20 can be configured to present a first negative capacitance $C_{NEG-A}$ ($C_{NEG-A} \in C_{NEGi}$) at a first operating frequency $f_{OPER-A}$ ($f_{OPER-A} \in f_{OPERi}$), while both the first acoustic resonator 30 and the second acoustic resonator 32 are both configured to resonate at the first operating frequency $f_{OPER-A}$ to become a short between the signal input $S_{IN}$ and the signal output Sour. In other words, the first operating frequency $f_{OPER}$-A essentially becomes the series resonance frequency of the first acoustic resonator 30 and the second acoustic resonator 32.

When the first acoustic resonator 30 and the second acoustic resonator 32 are both acting as short circuits, the first negative capacitance $C_{NEG-A}$ and the first operating frequency $f_{OPER-A}$ can be determined as in equations (Eq. 2 and 3) below.

$$C_{NEG-A} = -\frac{C_0 * K}{2 * (1 + K)} \tag{Eq. 2}$$

$$f_{OPER-A} = \frac{1}{2\pi\sqrt{L * C_0 * K}} \tag{Eq. 3}$$

Herein, L represents a respective inductance of the first inductor 22 and the second inductor 24, K represents a coupling factor between the first inductor 22 and the second inductor 24, and $C_0$ represents a capacitance of the tunable capacitor 26. For a more in-depth description of the negative resonant circuit 20, please refer to U.S. Pat. No. 11,742,818 B2, entitled "WIDE-BANDWIDTH RESONANT CIRCUIT."

In another embodiment, when the first acoustic resonator 30 and the second acoustic resonator 32 are both configured not to resonate at the first operating frequency $f_{OPER}$-A, the first acoustic resonator 30 and the second acoustic resonator 32 will no longer act as the short circuit between the input node $S_{IN}$ and the output node $S_{OUT}$. As a result, the first acoustic resonator 30 and the second acoustic resonator 32 will each present a respective second negative capacitance $C_{NEG-B}$ ($C_{NEG-B} \in C_{NEGi}$) at a second operating frequency $f_{OPER-B}$ ($f_{OPER-B} \in f_{OPERi}$). Herein, the second negative capacitance $C_{NEG-B}$ and the second operating frequency $f_{OPER-B}$ can be defined by equations (Eq. 4 and 5) below.

$$C_{NEG-B} = -\frac{C_0}{(1 + N * K)} \tag{Eq. 4}$$

$$f_{OPER-B} = \frac{1}{2\pi\sqrt{L * C_0 * N}} \tag{Eq. 5}$$

In the equations (Eq. 4 and 5), L represents a respective inductance of the first inductor 22 and the second inductor 24, K represents a coupling factor between the first inductor 22 and the second inductor 24, $C_0$ represents a respective capacitance of the tunable capacitor 26, and N is a positive integer greater than one (N>1). As shown in the equation (Eq. 4), the second negative capacitance $C_{NEG-B}$ can be adjusted by adjusting the capacitance of the tunable capacitor 26 and/or the integer number N. Likewise, as shown in the equation (Eq. 5), the second operating frequency $f_{NEG-B}$ can also be adjusted by adjusting the capacitance of the tunable capacitor 26 and/or the integer number N. As such, the negative capacitance circuit 12A can be tuned to provide any of the negative capacitances $C_{NEGi}$ (i>1) in any of the operating frequencies $f_{OPERi}$ (i>1) in the operating frequency range $f_{OPER}$.

FIG. 2B is a schematic diagram of an exemplary negative capacitance circuit 12B configured according to one embodiment of the present disclosure to be provided in the acoustic filter circuit 10 of FIG. 1 as the negative capacitance circuit 12. Herein, the negative capacitance circuit 12B includes multiple first acoustic resonators 34(1)-34(X) and multiple second acoustic resonators 36(1)-36(X). The first acoustic resonators 34(1)-34(X) are coupled in parallel between the input node $S_{IN}$ and the negative resonant circuit 20. The second acoustic resonators 36(1)-36(X) are coupled in parallel between the negative resonant circuit 20 and the output node $S_{OUT}$.

In an embodiment, each of the first acoustic resonators 34(1)-34(X) can be configured according to different integer numbers N. Similarly, the second acoustic resonators 36(1)-36(X) can be configured according to different integer numbers N. Notably, for each of the first acoustic resonators $34(1)$-$34(X)$, there shall be a corresponding one of the second acoustic resonators $36(1)$-$36(X)$ having an identical integer number N. As such, the first acoustic resonators $34(1)$-$34(X)$ and the second acoustic resonators $36(1)$-$36(X)$ can collectively provide a set of the second negative capacitance $C_{NEG-B}$ ($C_{NEG-B} \in C_{NEGi}$) at a set of the second operating frequency $f_{OPER-B}$ ($f_{OPER-B} \in f_{OPERi}$). In this regard, the negative capacitance circuit 12 may concurrently cancel the inherent capacitance $C_{EQ}$ at each of the set of the second operating frequency $f_{OPER-B}$.

Figure 3:
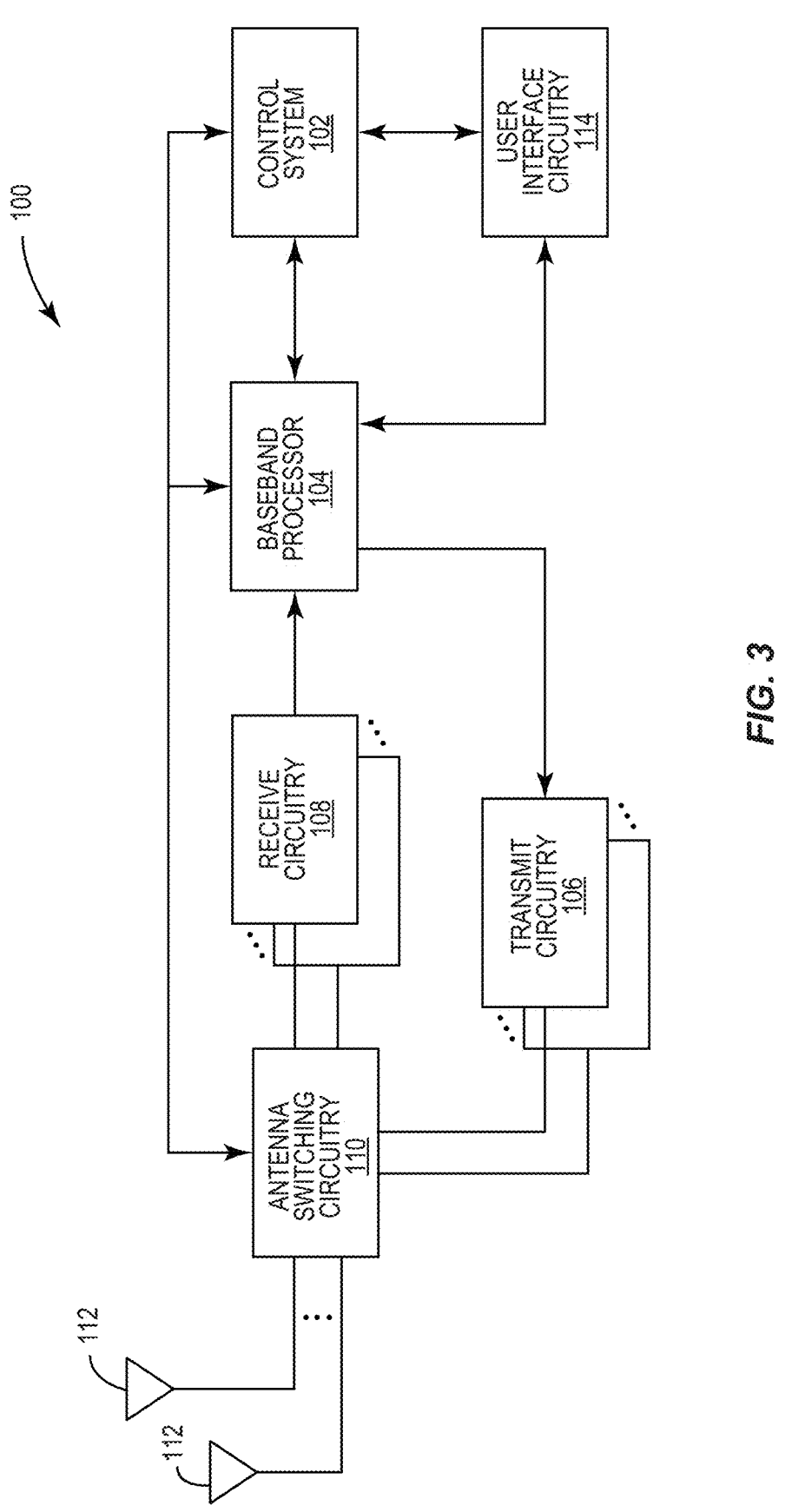
FIG. 3 is a schematic diagram of an exemplary communication device wherein the acoustic filter circuit of FIG. 1 can be provided.

The acoustic filter circuit 10 of FIG. 1 can be provided in a communication device to support the embodiments described above. In this regard, FIG. 3 is a schematic diagram of an exemplary communication device 100 wherein the acoustic filter circuit 10 of FIG. 1 can be provided.

Herein, the communication device 100 can be any type of communication devices, such as mobile terminals, smart watches, tablets, computers, navigation devices, access points, and like wireless communication devices that support wireless communications, such as cellular, wireless local area network (WLAN), Bluetooth, and near field communications. The communication device 100 can generally include a control system 102, a baseband processor 104, transmit circuitry 106, receive circuitry 108, antenna switching circuitry 110, multiple antennas 112, and user interface circuitry 114. In a non-limiting example, the control system 102 can be a field-programmable gate array (FPGA), as an example. In this regard, the control system 102 can include at least a microprocessor(s), an embedded memory circuit(s), and a communication bus interface(s). The receive circuitry 108 receives radio frequency signals via the antennas 112 and through the antenna switching circuitry 110 from one or more base stations. A low noise amplifier and a filter cooperate to amplify and remove broadband interference from the received signal for processing. Downconversion and digitization circuitry (not shown) will then downconvert the filtered, received signal to an intermediate or baseband frequency signal, which is then digitized into one or more digital streams using an analog-to-digital converter(s) (ADC).

The baseband processor 104 processes the digitized received signal to extract the information or data bits conveyed in the received signal. This processing typically comprises demodulation, decoding, and error correction operations, as will be discussed in greater detail below. The baseband processor 104 is generally implemented in one or more digital signal processors (DSPs) and application specific integrated circuits (ASICs).

For transmission, the baseband processor 104 receives digitized data, which may represent voice, data, or control information, from the control system 102, which it encodes for transmission. The encoded data is output to the transmit circuitry 106, where a digital-to-analog converter(s) (DAC) converts the digitally encoded data into an analog signal and a modulator modulates the analog signal onto a carrier signal that is at a desired transmit frequency or frequencies. A power amplifier will amplify the modulated carrier signal to a level appropriate for transmission, and deliver the modulated carrier signal to the antennas 112 through the antenna switching circuitry 110. The multiple antennas 112 and the replicated transmit and receive circuitries 106, 108 may provide spatial diversity. Modulation and processing details will be understood by those skilled in the art.

In an embodiment, the acoustic filter circuit 10 of FIG. 1 can be provided in the transmit circuitry 106, the receive circuitry 108, and/or the antenna switching circuitry 110. Understandably, the acoustic filter circuit 10 can also be provided anywhere else in the communication device 100.

In an embodiment, the acoustic filter circuit 10 can also be tuned in accordance with a process. In this regard, FIG. 4 is a flowchart of an exemplary process 200 for cancelling the inherent capacitance $C_{EQ}$ in the operating frequency range $f_{OPER}$ in the acoustic filter circuit 10 of FIG. 1.

Herein, the process 200 includes configuring the acoustic resonator 14 to resonate in the series resonance frequency $f_S$ to pass the signal 16 from the input node $S_{IN}$ to the output node $S_{OUT}$ (step 202). The process 200 also includes presenting the negative capacitances $C_{NEGi}$ each at a respective one of the operating frequencies $f_{OPERi}$ in the operating frequency range $f_{OPER}$ nonoverlapping with the series resonance frequency $f_S$ between the input node $S_{IN}$ and the output node $S_{OUT}$ (step 204).

Those skilled in the art will recognize improvements and modifications to the embodiments of the present disclosure. All such improvements and modifications are considered within the scope of the concepts disclosed herein and the claims that follow.

What is claimed is:

1. An acoustic filter circuit comprising:
an acoustic resonator coupled between an input node and an output node and configured to resonate in a series resonance frequency to pass a radio frequency (RF) signal from the input node to the output node; and
a negative capacitance circuit coupled in parallel to the acoustic resonator between the input node and the output node and configured to present a plurality of negative capacitances each at a respective one of a plurality of operating frequencies in an operating frequency range nonoverlapping with the series resonance frequency between the input node and the output node.

2. The acoustic filter circuit of claim 1, wherein the negative capacitance circuit comprises a negative resonant circuit, the negative resonant circuit comprises:
a first inductor coupled between the input node and a middle node;
a second inductor coupled between the middle node and the output node; and
a tunable capacitor coupled between the middle node and a ground.

3. The acoustic filter circuit of claim 2, wherein the negative resonant circuit is configured to present a first negative capacitance among the plurality of negative capacitances at a first operating frequency among the plurality of operating frequencies.

4. The acoustic filter circuit of claim 3, wherein the negative capacitance circuit further comprises:
a first acoustic resonator coupled between the input node and the negative resonant circuit; and
a second acoustic resonator coupled between the negative resonant circuit and the output node.

5. The acoustic filter circuit of claim 4, wherein the first acoustic resonator and the second acoustic resonator are each configured to present a second negative capacitance among the plurality of negative capacitances at a second operating frequency among the plurality of operating frequencies.

6. The acoustic filter circuit of claim 5, wherein the second operating frequency is identical to the first operating frequency.

7. The acoustic filter circuit of claim 5, wherein the second operating frequency is different from the first operating frequency.

8. The acoustic filter circuit of claim 5, wherein:

the second negative capacitance is expressed as: $-C_0/(1+N*K)$; and the second operating frequency is expressed as: $\frac{1}{2}\pi\sqrt{L*C_0/N}$;

wherein:

L represents a respective inductance of the first inductor and the second inductor;

K represents a coupling factor between the first inductor and the second inductor;

$C_0$ represents a respective capacitance of the tunable capacitor; and

N is a positive integer greater than one.

9. The acoustic filter circuit of claim 2, wherein the negative capacitance circuit further comprises:

a plurality of first acoustic resonators coupled in parallel between the input node and the negative resonant circuit; and a plurality of second acoustic resonators coupled in parallel between the negative resonant circuit and the output node.

10. The acoustic filter circuit of claim 9, wherein the plurality of first acoustic resonators and the plurality of second acoustic resonators collectively provide a set of second negative capacitances at a set of second operating frequencies, respectively.

11. A wireless device comprising an acoustic filter circuit, the acoustic filter circuit comprising:

an acoustic resonator coupled between an input node and an output node and configured to resonate in a series resonance frequency to pass a radio frequency (RF) signal from the input node to the output node; and a negative capacitance circuit coupled in parallel to the acoustic resonator between the input node and the output node and configured to present a plurality of negative capacitances each at a respective one of a plurality of operating frequencies in an operating frequency range nonoverlapping with the series resonance frequency between the input node and the output node.

12. The wireless device of claim 11, wherein the negative capacitance circuit comprises a negative resonant circuit, the negative resonant circuit comprises:

a first inductor coupled between the input node and a middle node;

a second inductor coupled between the middle node and the output node; and a tunable capacitor coupled between the middle node and a ground.

13. The wireless device of claim 12, wherein the negative resonant circuit is configured to present a first negative capacitance among the plurality of negative capacitances at a first operating frequency among the plurality of operating frequencies.

14. The wireless device of claim 13, wherein the negative capacitance circuit further comprises:

a first acoustic resonator coupled between the input node and the negative resonant circuit; and a second acoustic resonator coupled between the negative resonant circuit and the output node.

15. The wireless device of claim 14, wherein the first acoustic resonator and the second acoustic resonator are each configured to present a second negative capacitance among the plurality of negative capacitances at a second operating frequency among the plurality of operating frequencies.

16. The wireless device of claim 15, wherein the second operating frequency is identical to the first operating frequency.

17. The wireless device of claim 15, wherein the second operating frequency is different from the first operating frequency.

18. The wireless device of claim 12, wherein the negative capacitance circuit further comprises:

a plurality of first acoustic resonators coupled in parallel between the input node and the negative resonant circuit; and a plurality of second acoustic resonators coupled in parallel between the negative resonant circuit and the output node.

19. The wireless device of claim 18, wherein the plurality of first acoustic resonators and the plurality of second acoustic resonators collectively provide a set of second negative capacitances at a set of second operating frequencies, respectively.

20. A method for cancelling multiple capacitances in an acoustic filter circuit comprising:

configuring an acoustic resonator to resonate in a series resonance frequency to pass a radio frequency (RF) signal from an input node to an output node; and presenting a plurality of negative capacitances each at a respective one of a plurality of operating frequencies in an operating frequency range nonoverlapping with the series resonance frequency between the input node and the output node.

* * * * *